US012562711B2

(12) United States Patent
Caron et al.

(10) Patent No.: US 12,562,711 B2
(45) Date of Patent: Feb. 24, 2026

(54) WAFER LEVEL PACKAGE HAVING ENHANCED THERMAL DISSIPATION

(71) Applicant: SKYWORKS SOLUTIONS, INC., Irvine, CA (US)

(72) Inventors: Joshua James Caron, Summerfield, NC (US); Eesa Rahimi, Greensboro, NC (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 807 days.

(21) Appl. No.: 17/810,869

(22) Filed: Jul. 6, 2022

(65) Prior Publication Data

US 2023/0013541 A1 Jan. 19, 2023

Related U.S. Application Data

(60) Provisional application No. 63/222,066, filed on Jul. 15, 2021.

(51) Int. Cl.
| | |
|---|---|
| *H03H 9/02* | (2006.01) |
| *H03F 1/30* | (2006.01) |
| *H03H 9/00* | (2006.01) |
| *H03H 9/08* | (2006.01) |
| *H03H 9/10* | (2006.01) |
| *H03H 9/64* | (2006.01) |

(52) U.S. Cl.
CPC ......... *H03H 9/02834* (2013.01); *H03F 1/303* (2013.01); *H03H 9/0028* (2013.01); *H03H 9/08* (2013.01); *H03H 9/1092* (2013.01);

*H03H 9/6406* (2013.01); *H03H 9/6489* (2013.01); *H03F 2200/171* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 7,230,512 B1 * | 6/2007 | Carpenter | ........... H03H 9/1071 |
| | | | 333/133 |
| 9,438,201 B2 | 9/2016 | Hori et al. | |
| 11,057,015 B2 * | 7/2021 | Kawasaki | ......... H03H 9/02543 |
| 11,133,789 B2 | 9/2021 | Keiichi et al. | |
| | (Continued) | | |

FOREIGN PATENT DOCUMENTS

| | | | | |
|---|---|---|---|---|
| CN | 107615660 B | * 12/2020 | ......... | H03H 9/02834 |
| WO | WO-2016158744 A1 | * 10/2016 | ............. | H03H 9/125 |
| | (Continued) | | | |

*Primary Examiner* — William J Klimowicz
(74) *Attorney, Agent, or Firm* — Lando & Anastasi, LLP

(57) ABSTRACT

A surface acoustic wave device including a piezoelectric layer, an interdigital transducer electrode over the piezoelectric layer, and a polymeric roof layer arranged over the piezoelectric layer and interdigital transducer electrode. The polymeric roof layer is spaced apart from the piezoelectric layer to define a cavity to accommodate the interdigital transducer electrode. The polymeric roof layer is supported along a span of the polymeric roof layer by at least one pillar. The thermal conductivity of the pillar is greater than the thermal conductivity of the polymeric roof layer. Related wafer-level packages, radio frequency modules and wireless communication devices are also provided.

20 Claims, 7 Drawing Sheets

(56) References Cited

U.S. PATENT DOCUMENTS

| | | | | |
|---|---|---|---|---|
| 11,233,026 | B2 * | 1/2022 | Otsuka | H01L 23/564 |
| 11,588,465 | B2 * | 2/2023 | Fukuhara | H03H 9/6406 |
| 11,984,874 | B2 * | 5/2024 | Dutta | H03H 9/1071 |
| 2007/0176250 | A1 * | 8/2007 | Lee | H03H 9/1092 |
| | | | | 257/416 |
| 2014/0339957 | A1 * | 11/2014 | Tajima | H03H 9/1092 |
| | | | | 29/874 |
| 2017/0214386 | A1 | 7/2017 | Kido | |
| 2017/0222618 | A1 | 8/2017 | Inoue et al. | |
| 2017/0250669 | A1 | 8/2017 | Kuroyanagi et al. | |
| 2017/0272051 | A1 | 9/2017 | Kurihara et al. | |
| 2017/0273183 | A1 * | 9/2017 | Kawasaki | H03H 3/08 |
| 2017/0288629 | A1 | 10/2017 | Bhattacharjee et al. | |
| 2018/0013404 | A1 | 1/2018 | Kawasaki et al. | |
| 2018/0316329 | A1 | 11/2018 | Guenard et al. | |
| 2018/0367117 | A1 * | 12/2018 | Goto | H03H 9/0576 |
| 2018/0367119 | A1 | 12/2018 | Lee | |
| 2019/0103852 | A1 * | 4/2019 | Gilbert | H01L 24/11 |
| 2019/0288661 | A1 | 9/2019 | Akiyama et al. | |
| 2019/0357381 | A1 * | 11/2019 | Maki | H03H 9/64 |
| 2020/0067482 | A1 | 2/2020 | Maki et al. | |
| 2020/0144984 | A1 * | 5/2020 | Fukuhara | H03H 9/02992 |
| 2020/0212883 | A1 * | 7/2020 | Goto | H03H 9/6406 |
| 2021/0058057 | A1 | 2/2021 | Goto et al. | |
| 2021/0159877 | A1 * | 5/2021 | Fukuhara | H03H 9/02574 |
| 2021/0159886 | A1 | 5/2021 | Goto et al. | |
| 2022/0077840 | A1 | 3/2022 | Caron | |
| 2022/0158612 | A1 * | 5/2022 | Goto | H03H 9/0561 |
| 2022/0329227 | A1 * | 10/2022 | Goto | H03H 9/0547 |
| 2023/0026465 | A1 * | 1/2023 | Huang | H03H 9/1071 |

FOREIGN PATENT DOCUMENTS

| | | | | |
|---|---|---|---|---|
| WO | WO-2016208287 | A1 * | 12/2016 | H03H 9/64 |
| WO | WO-2018003819 | A1 * | 1/2018 | H03H 9/1085 |

* cited by examiner deg
240
219
190
177
156
135
114
93
72
51
30

Pin =33 dBm
Tmax=236.1 ℃ deg
240
219
190
177
156
135
114
93
72
51
30

Pin =33 dBm
Tmax=151.7 ℃ deg
240
219
190
177
156
135
114
93
72
51
30

Pin =33 dBm
Tmax=132.4 ℃ deg
240
219
190
177
156
135
114
93
72
51
30

Pin =33 dBm
Tmax=135.6 ℃

WAFER LEVEL PACKAGE HAVING ENHANCED THERMAL DISSIPATION

CROSS-REFERENCE TO RELATED APPLICATIONS

This application claims priority under 35 U.S.C. § 119(e) to U.S. Provisional Patent Application Ser. No. 63/222,066, titled "WAFER LEVEL PACKAGE HAVING ENHANCED THERMAL DISSIPATION," filed Jul. 15, 2021, the entire contents of which is incorporated herein by reference for all purposes.

BACKGROUND

Field

Embodiments of the invention relate to wafer level packages. More particularly, at least some embodiments are directed to wafer-level packages for surface acoustic wave devices.

Description of the Related Technology

A surface acoustic wave filter can include a plurality of resonators arranged to filter a radio frequency signal. Each resonator can include a surface acoustic wave device. Surface acoustic wave filters can be implemented in radio frequency electronic systems. For instance, filters in a radio frequency front end of a mobile phone can include surface acoustic wave filters. Two surface acoustic wave filters can be arranged as a duplexer. Filtering signals having relatively high power levels can generate heat.

A temperature compensated surface acoustic wave filter is a filter which has been adapted to have improved thermal stability. The center frequency of a surface acoustic wave filter can vary with changes in temperature caused, for example, by heat generated during operation. A temperature compensated surface acoustic wave filter seeks to minimize variations in the center frequency as temperature changes.

A wafer-level package refers to an integrated circuit that is packaged while still part of a wafer, as opposed to separating the wafer into individual dies and packaging each die separately. The resulting wafer-level package is a chip-scale package because the package is substantially the same size as, or only marginally larger than, the size of the die.

SUMMARY

According to one embodiment, there is provided a surface acoustic wave device that includes a piezoelectric layer, an interdigital transducer electrode over the piezoelectric layer, and a polymeric roof layer arranged over the piezoelectric layer and interdigital transducer electrode. The polymeric roof layer is spaced apart from the piezoelectric layer to define a cavity to accommodate the interdigital transducer electrode. The polymeric roof layer is supported along a span of the polymeric roof layer by at least one pillar. The thermal conductivity of the pillar is greater than the thermal conductivity of the polymeric roof layer.

The thermal conductivity of the at least one pillar may be more than 25 times the thermal conductivity of the polymeric roof layer. The thermal conductivity of the at least one pillar may be more than 50 times the thermal conductivity of the polymeric roof layer. The thermal conductivity of the at least one pillar may be more than 100 times the thermal conductivity of the polymeric roof layer.

The thermal conductivity of the at least one pillar may be greater than 50 W/mK. The thermal conductivity of the at least one pillar may be greater than 100 W/mK. The thermal conductivity of the at least one pillar may be greater than 200 W/mK. The thermal conductivity of the at least one pillar may be greater than 300 W/mK.

The thermal conductivity of the at least one pillar may be between 50 W/mK and 450 W/mK. The thermal conductivity of the at least one pillar may be between 100 W/mK and 450 W/mK. The thermal conductivity of the at least one pillar may be between 200 W/mK and 450 W/mK. The thermal conductivity of the at least one pillar may be between 300 W/mK and 450 W/mK.

In one example, the pillar may comprise a metal or metal alloy. The metal or metal alloy may include one or more of aluminum, copper, silver, gold, and tungsten.

In one example, the at least one pillar may be arranged adjacent to the interdigital transducer electrode.

In one example, the surface acoustic wave device may further include a first metal layer. The interdigital transducer electrode may be formed from the first metal layer.

In one example, the surface acoustic wave device may further include a second metal layer over at least a portion of the first metal layer. The at least one pillar may be formed from the second metal layer.

In one example, the at least one pillar may be formed from an increased thickness of the second metal layer in a direction perpendicular to the plane of the piezoelectric layer at a location at which the polymeric roof layer is to be supported.

In one example, the second metal layer may have a thickness in a direction perpendicular to the plane of the piezoelectric layer at a location at which the polymeric roof layer is to be supported of between 3 microns and 15 microns.

In one example, the second metal layer may have a thickness in a direction perpendicular to the plane of the piezoelectric layer at a location at which the polymeric roof layer is to be supported of between 3 microns and 8 microns, preferably between 3 microns and 6 microns and more preferably between 3 microns and 5 microns.

In one example, the second metal layer may have a thickness in a direction perpendicular to the plane of the piezoelectric layer at a location at which the polymeric roof layer is to be supported of between 10 microns and 14 microns and preferably between 11 microns and 13 microns.

In one example, the second metal layer may have a thickness in a direction perpendicular to the plane of the piezoelectric layer at a location at which the polymeric roof layer is not supported by a pillar of between 1 microns and 2 microns.

In one example, the surface acoustic wave device may further include a polymeric perimeter wall. The polymeric perimeter wall may support the polymeric roof layer around a perimeter of the polymer roof layer.

In one example, the height of the polymeric perimeter wall may be the same as the at least one pillar.

In one example, the surface acoustic wave device may include a plurality of pillars.

In one example, the surface acoustic wave device may further include a metallic roof layer. The metallic roof layer may be over the polymeric roof layer.

In one example, the surface acoustic wave device may further include a temperature compensation layer. The temperature compensation layer may be over the interdigital transducer electrode. The temperature compensation layer may be in physical contact with the interdigital transducer electrode.

In one example, the piezoelectric layer may have a negative temperature coefficient of frequency. The temperature compensation layer may have a positive temperature coefficient of frequency.

In one example, the temperature compensation layer may comprise silicon dioxide.

According to another embodiment, there is provided a wafer-level package that includes a piezoelectric layer, an interdigital transducer electrode over the piezoelectric layer, and a polymeric roof layer arranged over the piezoelectric layer and interdigital transducer electrode. The polymeric roof layer is spaced apart from the piezoelectric layer to define a cavity to accommodate the interdigital transducer electrode. The polymeric roof layer is supported along a span of the polymeric roof layer by at least one pillar. The thermal conductivity of the pillar is greater than the thermal conductivity of the polymeric roof layer.

The wafer-level package may include one or more suitable features of any of the surface acoustic wave devices discussed herein.

According to another embodiment, there is provided a surface acoustic wave filter configured to filter a radio frequency signal. The surface acoustic wave filter includes a piezoelectric layer, an interdigital transducer electrode over the piezoelectric layer, and a polymeric roof layer arranged over the piezoelectric layer and interdigital transducer electrode. The polymeric roof layer is spaced apart from the piezoelectric layer to define a cavity to accommodate the interdigital transducer electrode. The polymeric roof layer is supported along a span of the polymeric roof layer by at least one pillar. The thermal conductivity of the pillar is greater than the thermal conductivity of the polymeric roof layer.

The surface acoustic wave filter may include one or more suitable features of any of the surface acoustic wave devices discussed herein.

According to another embodiment, there is provided a radio frequency module that includes a power amplifier configured to provide a radio frequency signal, and a surface acoustic wave filter configured to filter the radio frequency signal. The surface acoustic wave filter includes a piezoelectric layer, an interdigital transducer electrode over the piezoelectric layer, and a polymeric roof layer arranged over the piezoelectric layer and interdigital transducer electrode. The polymeric roof layer is spaced apart from the piezoelectric layer to define a cavity to accommodate the interdigital transducer electrode. The polymeric roof layer is supported along a span of the polymeric roof layer by at least one pillar. The thermal conductivity of the pillar is greater than the thermal conductivity of the polymeric roof layer.

The radio frequency module may include one or more suitable features of any of the surface acoustic wave devices discussed herein.

According to another embodiment, there is provided a wireless communication device that includes a surface acoustic wave filter configured to provide a filtered radio frequency signal. The surface acoustic wave filter includes a piezoelectric layer, an interdigital transducer electrode over the piezoelectric layer, and a polymeric roof layer arranged over the piezoelectric layer and interdigital transducer electrode. The polymeric roof layer is spaced apart from the piezoelectric layer to define a cavity to accommodate the interdigital transducer electrode. The polymeric roof layer is supported along a span of the polymeric roof layer by at least one pillar. The thermal conductivity of the pillar is greater than the thermal conductivity of the polymeric roof layer.

The wireless communication device may include one or more suitable features of any of the surface acoustic wave devices discussed herein.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
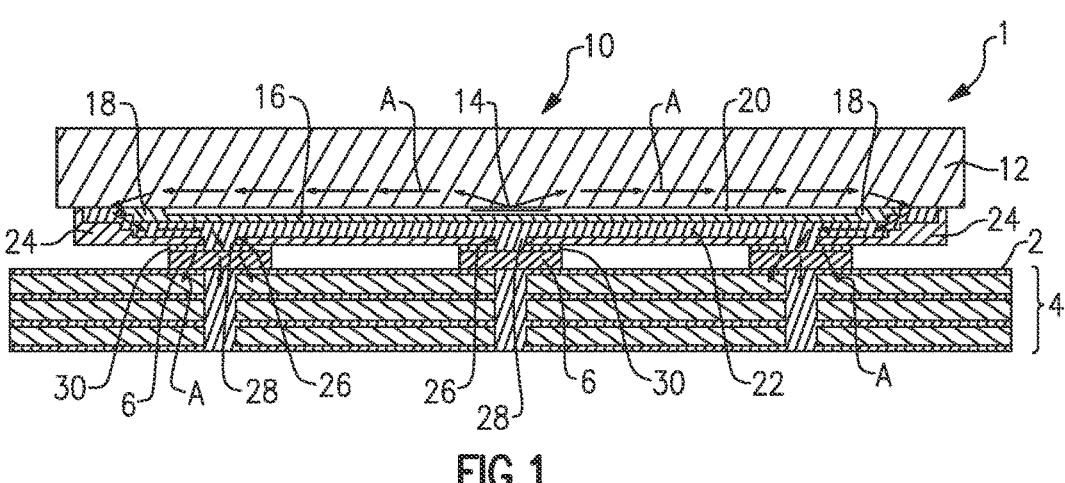
FIG. 1 is a cross-section of a surface acoustic wave device having a polymeric roof layer.

Aspects and embodiments described herein are directed to a surface acoustic wave device having a pillar for supporting a span of a polymeric roof layer. The pillar has a high thermal conductivity which provides for more efficient transfer of heat from the piezoelectric layer and interdigital transducer electrode to and through the polymeric roof layer so that it can be dissipated from the device. This improves the power handling capabilities of surface acoustic wave (SAW) and temperature-compensated surface acoustic wave (TC-SAW) filters by improving the ability to conduct heat away from the filter, thereby lowering the temperature of the filter even when the total amount of dissipated power has not been decreased.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

SAW and TC-SAW filters are often used for radio frequency filtering applications at relatively high power levels. Since these filters are not perfectly lossless, some power dissipation occurs within the filter. This excess heat can cause accelerated aging of the filter, or even catastrophic damage.

Since typical SAW and TC-SAW devices have a non-zero temperature coefficient of frequency, the temperature rise resulting from the aforementioned power dissipation causes a shift in the frequency response of the passband. At frequencies close to the passband edges (the upper passband edge if the temperature coefficient of frequency is negative or the lower passband edge if the temperature coefficient of frequency is positive) this frequency shift can cause an increase in filter insertion loss and cause even more power to be dissipated. Increased power dissipation causes the temperature to rise even more, thereby further increasing the insertion loss. This thermal runaway effect can quickly lead to catastrophic damage if left unchecked. This, in turn, effectively limits the amount of power that can be passed through a SAW or TC-SAW filter.

Meanwhile, many applications, including fifth generation (5G) mobile handsets, are requiring higher and higher power operation. It would therefore be desirable to be able to provide SAW and TC-SAW filters that are able to meet the power requirements.

FIG. 1 is a cross-sectional view of a wafer-level package 1 including a surface acoustic wave resonator or device 10. The wafer-level package 1 is mounted onto a printed circuit board 2 of a multi-chip module 4 by means of solder bumps 6. The surface acoustic wave device 10 includes a piezoelectric substrate or layer 12, an interdigital transducer electrode 14 over the piezoelectric layer 12 and a polymeric roof layer 16 arranged over the piezoelectric layer 12 and interdigital transducer electrode 14.

Figure 5:
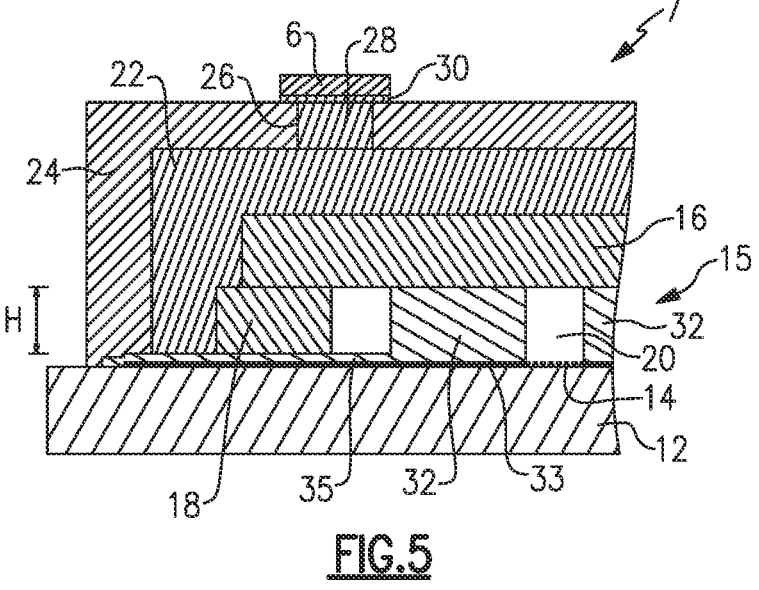
FIG. 5 is a cross-section of a portion of a surface acoustic wave device according to another embodiment.
Figure 6:
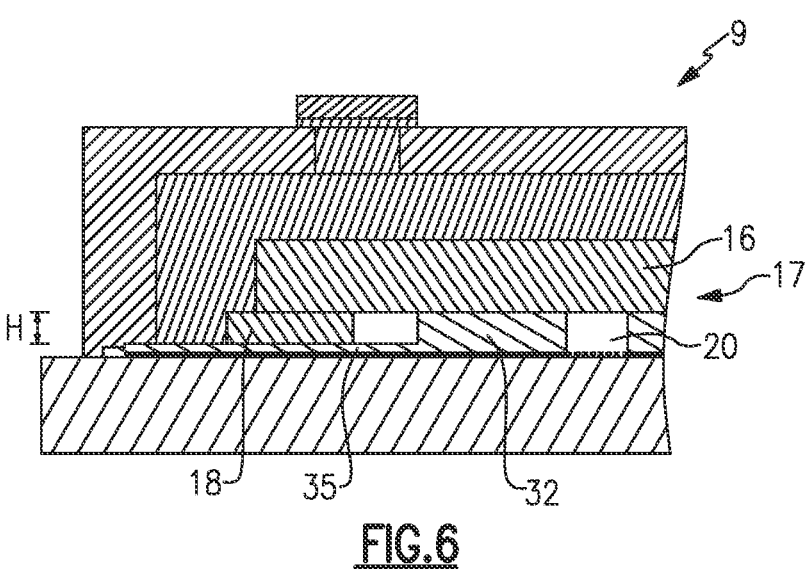
FIG. 6 is a cross-section of a portion of a surface acoustic wave device according to another embodiment.

In FIG. 1, the interdigital transducer electrode 14 is shown on an underside of the piezoelectric layer 12, whereas surface acoustic wave devices are typically illustrated with the interdigital transducer electrode on an upper surface of the piezoelectric layer, for example, see FIGS. 5 and 6. However, it will be appreciated that the surface acoustic wave device 10 of the embodiment of FIG. 1 is a part of a wafer-level package or "flip chip" in which the package and electrical connectors are formed over the surface acoustic wave device 10 on an upper side of the surface acoustic wave device 10. To connect the surface acoustic wave device 10 to a printed circuit board, the wafer-level package 1 is flipped over so that the electrical connectors are face down, as shown in FIG. 1. As can also be seen in FIG. 1, the size of the wafer-level package 1 is approximately the same size as the piezoelectric layer 12 or die on which the circuit structures of the surface acoustic wave device 10 are formed and therefore the wafer-level package 1 is also a chip-scale package.

The piezoelectric layer 12 can be any suitable piezoelectric layer, such as a lithium niobate (LN) layer or lithium tantalate (LT) layer. The interdigital transducer electrode 14 can include aluminum (Al) or any suitable alloy thereof. The interdigital transducer electrode 14 can include two or more conductive layers in some instances. Such an interdigital transducer electrode 14 can include aluminum (Al) and another conductive layer such as molybdenum (Mo), tungsten (W), gold (Au), silver (Ag), copper (Cu), platinum (Pt), ruthenium (Ru), titanium (Ti), or a combination or alloy of two or more of these materials.

The polymeric roof layer 16 is supported around its perimeter by a polymeric perimeter wall 18. The height or the thickness of the polymeric perimeter wall 18 in a direction perpendicular to the plane of the piezoelectric layer 12 is approximately 12 microns. The polymeric roof layer 16 is therefore spaced apart from the piezoelectric layer 12 by a distance of approximately 12 microns to define a cavity 20 to accommodate the interdigital transducer electrode 14. The cavity 20 provides an air gap over the interdigital transducer electrode 14 and avoids contact between the interdigital transducer electrode 14 and other components of the surface acoustic wave device 10, which could adversely affect acoustic performance of the device.

The polymeric roof layer 16 can include any suitable polymer or dielectric film such as polyimide. Preferably, the polymeric roof layer 16 is photo-definable. The polymeric perimeter wall 18 is formed from the same material as the polymeric roof layer 16. The polymeric perimeter wall is formed by dry film stretching a layer of photo-definable polymer over the surface acoustic wave device 10. A pattern of the polymeric perimeter wall 18 is then applied to the polymer layer by exposure to ultraviolet light and the unwanted parts of the pattern are removed by a suitable etching process to leave the polymeric perimeter wall 18 which extends continuously around the perimeter of the surface acoustic wave device 10. The polymeric roof layer 16 is then dry film stretched over the polymeric perimeter wall 18.

The surface acoustic wave device 10 also includes a metallic roof layer 22 over the polymeric roof layer 16. The metallic roof layer 22 can include any metal or metal alloy with suitable electrical conductivity such as copper. The metallic roof layer 22 extends over the polymeric perimeter wall 18 and up to contact the piezoelectric layer 12 outside the polymeric perimeter wall 18. The metallic roof layer 22 can be patterned (not shown) to form electrical interconnections between electrical contact areas (not shown) on the piezoelectric layer 12. The electrical contact areas on the piezoelectric layer 12 extend outside of the polymeric perimeter wall 18 to allow electrical contact to be made with the metallic roof layer 22. The metallic roof layer 22 provides further mechanical support for the polymeric roof layer 16 and also acts as a redistribution layer providing electrical interconnection between different components of the surface acoustic wave device 10.

A dielectric layer 24 is arranged over the metallic roof layer 22 of the surface acoustic wave device 10. The dielectric layer 24 can include any suitable dielectric material such as polyimide. Preferably, the dielectric layer 24 is photo-definable. Via holes 26 are formed in the dielectric layer 24 which are occupied by electrically conductive vias 28 to provide electrical connection between the metallic roof layer 22 and contact pads 30 formed over the dielectric layer 24. The vias 28 and contact pads 30 are formed from any suitable electrically conductive material such as copper. Flattened solder bumps or balls 6 are arranged on the contact pads 30 and are used to electrically connect the surface acoustic wave device 10 to the printed circuit board 2.

In use, heat is generated by the surface acoustic wave device 10 in the region of the interdigital transducer electrode 14. Heat generation is a particular problem when the surface acoustic wave device 10 is being used at high power. Known surface acoustic wave devices have limited ability to withstand high power and the fragility of such devices is greatly exacerbated by heat. Furthermore, the design of known surface acoustic wave devices do not allow for efficient dissipation of heat from the device. Poor thermal conductivity of the piezoelectric layer and the air gap over the interdigital transducer electrode inhibit heat dissipation leading to excessive self-heating.

In FIG. 1, arrows A denote a thermal conduction pathway showing how heat is dissipated from the surface acoustic wave device 10. The thermal conduction pathway starts at the interdigital transducer electrode 14 where the heat is generated. Since the air gap over the interdigital transducer electrode 14 inhibits heat transfer, heat flows laterally outwards on either side of the interdigital transducer electrode 14 through the piezoelectric layer 12 to the perimeter of the piezoelectric layer 12 where it reaches the point that the metallic roof layer 22 contacts the piezoelectric layer 12. Heat is conducted down through the metallic roof layer 22 and through the electrically conductive vias 28, contact pads 30 and solder bumps 6 into the underlying printed circuit board 2 of the multi-chip module 4, which acts as a heat sink. However, piezoelectric materials such as lithium niobate, from which the piezoelectric layer is made, have poor thermal conductivity. Furthermore, in the arrangement of FIG. 1, the thermal conduction pathway denoted by arrows A is relatively long and tortuous and heat dissipation from the surface acoustic wave device 10 is not particularly efficient. These factors can lead to excessive self-heating of the surface acoustic wave device 10, which can degrade performance.

Figure 2:
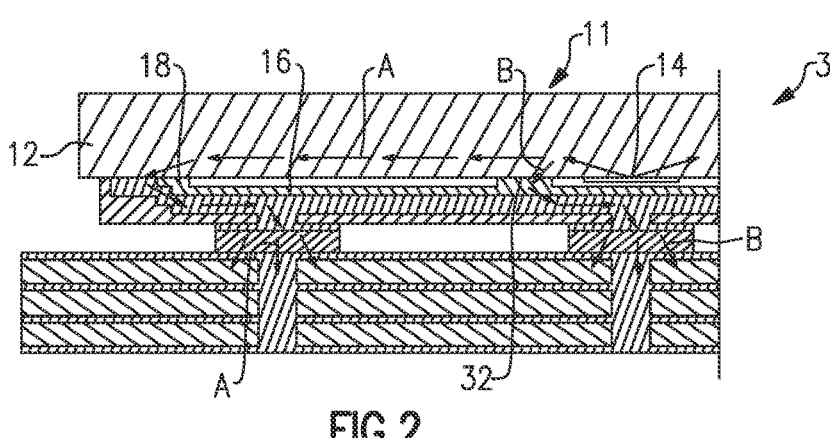
FIG. 2 is a cross-section of a portion of a surface acoustic wave device having a polymeric pillar supporting a polymeric roof layer.

FIG. 2 is a cross-sectional view of a portion of a wafer-level package 3 including a surface acoustic wave resonator or device 11. The wafer-level package 3 and surface acoustic wave device 11 are like the wafer-level package 1 and surface acoustic wave device 10 of FIG. 1 except that the surface acoustic wave device 11 includes a pillar 32 for supporting the polymeric roof layer 16. The pillar 32 can include any suitable polymer or insulating material. This helps to avoid the pillar electrically shorting any components arranged on the piezoelectric layer 12 such as electrical interconnections. Preferably, the pillar 32 is made from the same material as the polymeric roof layer 16 and polymeric perimeter wall 18 so that it can be formed by the same process described above for forming the polymeric perimeter wall 18. In the embodiment of FIG. 2, the pillar 32 is formed from polyimide. The pillar 32 is arranged adjacent to, or in proximity to, the interdigital transducer electrode 14 at a point along the span of the polymeric roof layer 16. Although not shown in FIG. 2, the surface acoustic wave device 11 may include a plurality of pillars arranged at various points along the span of the polymeric roof layer 16.

The pillar 32 helps to reduce the likelihood of the polymeric roof layer 16 sagging and making contact with the interdigital transducer electrode 14, which could adversely affect performance of the surface acoustic wave device 11. The pillar 32 also helps to provide an additional thermal conduction pathway (denoted by arrows B) for dissipating heat from the surface acoustic wave device 11. As can be seen in FIG. 2, the pillar 32 creates a thermal bridge between the piezoelectric layer 12 and the polymeric roof layer 16 at a point closer to the interdigital transducer electrode 14 than the thermal conduction pathway denoted by arrows A. As a result, a portion of the heat generated by the interdigital transducer electrode 14 can be dissipated directly to the polymeric roof layer 16 without having to travel all the way to the perimeter of the piezoelectric layer 12. Instead, a portion of the heat can flow through the pillar 32 to the polymeric roof layer 16 and metallic roof layer 22, from where it can be conducted down into the underlying printed circuit board 2 of the multi-chip module 4 through an electrically conductive via 28, solder pad 30 and solder bump 6 that arranged closer to the interdigital transducer electrode 14. This provides a shorter thermal conduction pathway, as can be seen from arrows B, and for more efficient thermal dissipation from the device. However, the polymer material from which the pillar 32 is fabricated is a poor thermal conductor and therefore the impact of this improvement is limited.

Figure 3:
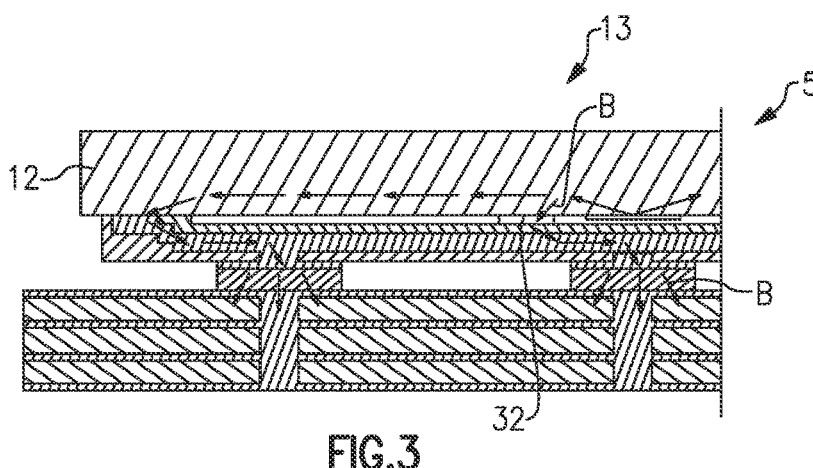
FIG. 3 is a cross-section of a portion of a surface acoustic wave device having a highly thermally conductive pillar supporting a polymeric roof layer according to an embodiment.

FIG. 3 is a cross-sectional view of a portion of a wafer-level package 5 including a surface acoustic wave resonator or device 13. The wafer-level package 5 and surface acoustic wave device 13 are like the wafer-level package 3 and surface acoustic wave device 11 of FIG. 2 except that the pillar 32 for supporting the polymeric roof layer 16 is formed from a highly thermally conductive material. The thermal conductivity of the pillar 32 is greater than 50 W/mK, preferably greater than 100 W/mK, more preferably greater than 200 W/mK, and yet preferably greater than 300 W/mK. The pillar 32 can include any material having suitably high thermal conductivity such as aluminum, copper, silver, gold and tungsten. Since these materials are also electrically conductive, the pillar 32 is carefully positioned on the piezoelectric layer 12 to avoid shorting circuit structures which are not intended to be connected together.

The pillar 32 in the embodiment of FIG. 3 provides the same thermal conduction pathway (denoted by arrows B) as the polymer pillar in the embodiment of FIG. 2. However, since the pillar 32 of the embodiment of FIG. 3 is formed from a highly thermally conductive material, heat transfer through the pillar 32 is considerably increased, which significantly improves heat dissipation from the surface acoustic wave device 13.

Figure 4A:
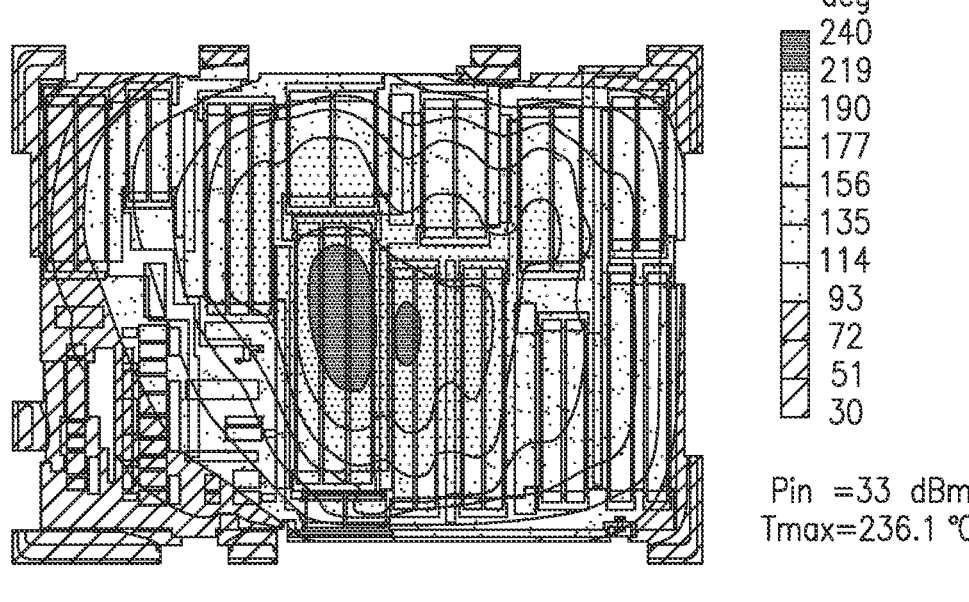
FIG. 4A is a simulated heat map of a surface acoustic wave device having polymeric pillars supporting a polymeric roof layer.

FIG. 4A is a simulated heat map of a surface acoustic wave device having polymeric pillars supporting a polymeric roof layer. The simulation includes a surface acoustic wave device similar to the surface acoustic wave device 11 of FIG. 2 and has polyimide pillars. The simulation in FIG. 4A corresponds to an input power of 33 dBm and an ambient temperature of 25 degrees centigrade. As shown in the heat map of FIG. 4A, the maximum temperature of the surface acoustic wave device was 236.1 degrees centigrade.

Figure 4B:
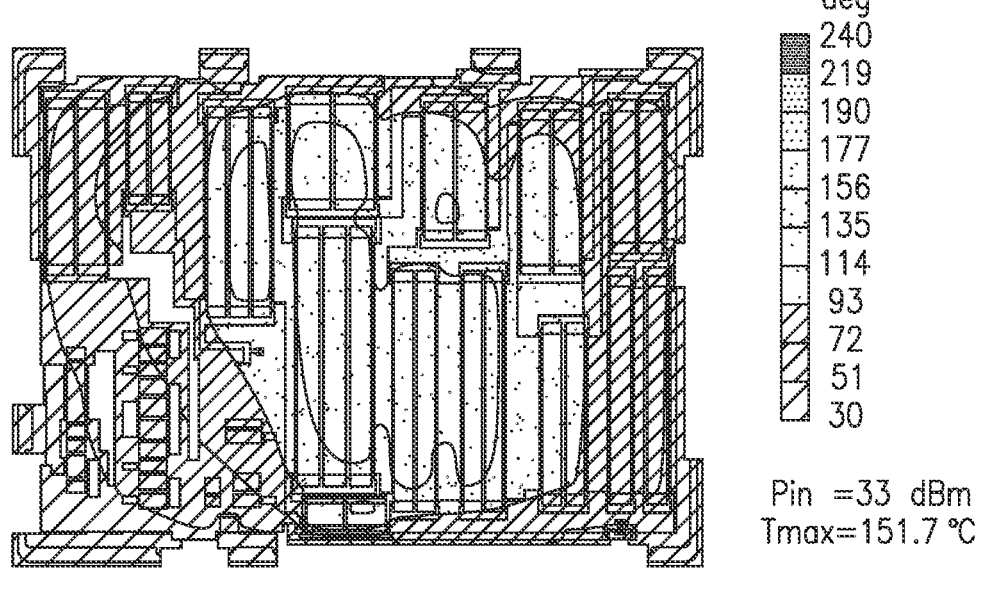
FIG. 4B is a simulated heat map of a surface acoustic wave device having highly thermally conductive pillars supporting a polymeric roof layer.

FIG. 4B is a simulated heat map of a surface acoustic wave device having highly thermally conductive pillars supporting a polymeric roof layer. The simulation includes a surface acoustic wave device similar to the surface acoustic wave device 13 of FIG. 3 and has copper pillars. As in FIG. 4A, the simulation in FIG. 4B corresponds to an input power of 33 dBm and an ambient temperature of 25 degrees centigrade. As shown in the heat map of FIG. 4B, the maximum temperature of the surface acoustic wave device was 151.7 degrees centigrade. This is a considerable reduction in maximum temperature compared to the simulation in FIG. 4A which used polyimide pillars and shows that providing highly thermally conductive pillars significantly improves thermal dissipation from the surface acoustic wave device.

FIG. 5 is a cross-sectional view of a portion of a wafer-level package 7 including a surface acoustic wave resonator or device 15. In FIG. 5, the surface acoustic wave device 15 is shown in a non-flipped orientation, that is, with an interdigital transducer electrode 14 on an upper side of a piezoelectric layer 12 and with the contact pads 30 and solder bumps 6 arranged above the piezoelectric layer 12.

The embodiment of FIG. 5 is similar to those illustrated in FIGS. 1 to 3. The surface acoustic wave device 15 includes a piezoelectric substrate or layer 12, an interdigital transducer electrode 14 over the piezoelectric layer 12 and a polymeric roof layer 16 arranged over the piezoelectric layer 12 and interdigital transducer electrode 14. The piezoelectric layer 12 can be any suitable piezoelectric layer, such as a lithium niobate (LN) layer or lithium tantalate (LT) layer.

The polymeric roof layer 16 can include any suitable polymer or dielectric film such as polyimide. Preferably, the polymeric roof layer 16 is photo-definable. The polymeric roof layer 16 is approximately 12 microns thick in a direction perpendicular to the plane of the piezoelectric layer 12. The polymeric roof layer 16 is supported around its perimeter by a polymeric perimeter wall 18. The height or the thickness H of the polymeric perimeter wall 18 in a direction perpendicular to the plane of the piezoelectric layer 12 is approximately 12 microns. The polymeric roof layer 16 is therefore spaced apart from the piezoelectric layer 12 by the height H of the polymeric perimeter wall 18 plus the height of any other structures the polymeric perimeter wall 18 passes over such as the first 33 and second 35 metal layers, which are generally relatively thin compared to the height of the polymeric perimeter wall 18. The space between the polymeric roof layer 16 and piezoelectric layer 12 defines a cavity 20 to accommodate the interdigital transducer electrode 14 and provides an air gap over the interdigital transducer electrode 14 to avoid contact between the interdigital transducer electrode 14 and other components of the surface acoustic wave device 15, which could adversely affect acoustic performance of the device. The polymeric perimeter wall 18 is fabricated from the same material as the polymeric roof layer 16 and is formed by the same process as the polymeric perimeter wall 18 of the embodiment of FIG. 1.

The interdigital transducer electrode 14 is formed from a first metal layer 33 over the piezoelectric layer 12. The first metal layer 33 can include aluminum (Al) or any suitable alloy thereof. The first metal layer 33 can include two or more conductive layers in some instances. Such a first metal layer can include aluminum (Al) and another conductive layer such as molybdenum (Mo), tungsten (W), gold (Au), silver (Ag), copper (Cu), platinum (Pt), ruthenium (Ru), titanium (Ti), or a combination or alloy of two or more of these materials.

The surface acoustic wave device 15 includes a second metal layer 35 over at least a portion of the first metal layer 33. The second metal layer 35 provides electrical interconnection between circuit structures formed from the first metal layer 33. In a region adjacent to, or in proximity to, the interdigital transducer electrode 14, the second metal layer 35 is formed with an increased thickness in a direction perpendicular to the plane of the piezoelectric layer 12. In the embodiment of FIG. 5, the increased thickness of the second metal layer 35 is equal to the height H of the polymeric perimeter wall 18, that is, approximately 12 microns, so that the second metal layer 35 in this region extends the entire height of the cavity 20 to form a pillar 32 to support the polymeric roof layer 16. Outside the location of the pillar 32, the second metal layer 35 is thinner, that is, approximately 1 to 2 microns thick in a direction perpendicular to the plane of the piezoelectric layer to allow for the polymeric perimeter wall 18 to pass over the second metal layer 35.

The surface acoustic wave device 15 of FIG. 5 may comprise a plurality of pillars 32. Indeed, a first pillar 32 is shown adjacent to the left side of the interdigital transducer electrode 14 and part of a second pillar 32 is shown adjacent to the right side of the interdigital transducer electrode 14. However, it will be appreciated that the surface acoustic wave device of FIG. 5 may have more than two pillars formed from an increased thickness of the second metal layer. Further such pillars may be provided adjacent to, or in proximity to, other interdigital transducer electrodes arranged on the piezoelectric layer 12. In the embodiment of FIG. 5, there is no need for polymeric cavity pillars such as those shown in FIG. 2 because the polymeric roof layer 16 is supported by the increased thickness of the second metal layer 35. Furthermore, since the fabrication process for creating the second metal layer 35 has better tolerances compared to the fabrication process for creating the polymeric pillar of the embodiment of FIG. 2, more pillars can be formed between circuit structures on the piezoelectric layer so that the polymeric roof layer 16 can be supported in more places.

The second metal layer 35 can include any suitable electrically conductive material such as copper or aluminum. These materials are also highly thermally conductive and therefore the pillar 32 forms a highly thermally conductive bridge for directly dissipating heat generated by the interdigital transducer electrode 13 to the polymeric roof layer 22.

The surface acoustic wave device 15 also includes a metallic roof layer 22 over the polymeric roof layer 16. The metallic roof layer 22 can include any metal or metal alloy with suitable electrical conductivity such as copper. The metallic roof layer 22 provides further mechanical support for the polymeric roof layer 16. The metallic roof layer 22 extends over the polymeric perimeter wall 18 and down to make contact with the second metal layer 35. The metallic roof layer 22 can be patterned (not shown) to form electrical interconnections between different parts of the second metal layer 35 which may be connected to different circuit structures at different locations on the piezoelectric layer 12. The second metal layer 35 extends outside of the polymeric perimeter wall 18 to allow electrical contact to be made with the metallic roof layer 22. The metallic roof layer 22 therefore also acts as a redistribution layer providing electrical interconnection between different components of the surface acoustic wave device 15 and also provides a thermal dissipation layer for dissipating heat generated by the interdigital transducer electrode 14.

A dielectric layer 24 is arranged over the metallic roof layer 22 of the surface acoustic wave device 15. The dielectric layer 24 can include any suitable dielectric material such as polyimide. Preferably, the dielectric layer 24 is photo-definable. A via hole 26 is formed in the dielectric layer 24 which is occupied by an electrically conductive via 28 to provide electrical connection between the metallic roof layer 22 and a contact pad 30 formed over the dielectric layer 24. The via 28 and contact pad 30 are formed from any suitable electrically conductive material such as copper. A flattened solder bump or ball 6 is arranged on the contact pad 30 and is used to electrically connect the surface acoustic wave device 15 to a printed circuit board (not shown).

In use, heat is generated by the surface acoustic wave device 15 in the region of the interdigital transducer electrode 14. Since the pillar 32 formed by the increased thickness of the second metal layer 35 is located adjacent to, or in proximity to, the interdigital transducer electrode 14, heat can be quickly conducted away from the interdigital transducer electrode 14 and directly to the polymeric roof layer 16. Heat is then conducted away from the polymeric roof layer 16 by the metallic roof layer 22 and dissipated to a printed circuit board (not shown) through the electrically conductive via 28, contact pad 30 and solder bump 6. The embodiment of FIG. 5 therefore provides an effective thermal conduction pathway for dissipating heating from the surface acoustic wave device 15.

FIG. 6 is a cross-sectional view of a portion of a wafer-level package 9 including a surface acoustic wave resonator or device 17. The wafer-level package 9 and surface acoustic wave device 17 are like the wafer-level package 7 and surface acoustic wave device 15 of FIG. 5 except that the height or the thickness H of the polymeric perimeter wall 18 in a direction perpendicular to the plane of the piezoelectric layer 12 has been reduced to approximately 4 microns. Accordingly, the amount by which the thickness of the second metal layer 35 is increased to form the pillar 32 has also been reduced from 12 microns to 4 microns in order to support the polymeric roof layer 16. This reduces the amount of the second metal layer material that has to be deposited to form the pillar 32, which provides for more efficient manufacturing of the surface acoustic wave device 17.

Figure 7A:
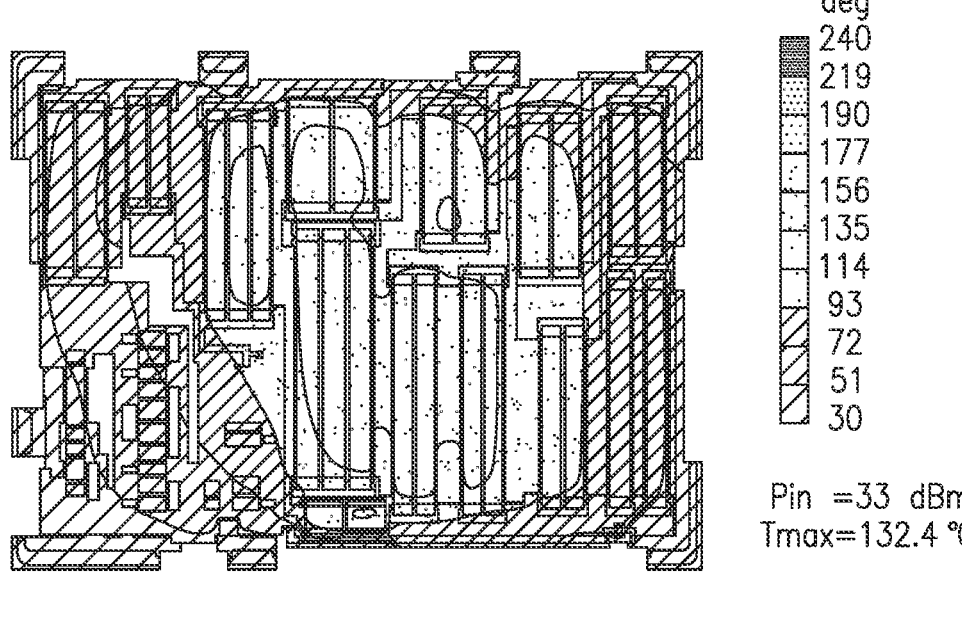
FIG. 7A is a simulated heat map of a surface acoustic wave device in which a polymeric roof layer is supported by a metal interconnect layer having a thickness of 12 microns.

FIG. 7A is a simulated heat map of a surface acoustic wave device in which a polymeric roof layer is supported by a metal interconnect layer having an increased thickness. The simulation includes a surface acoustic wave device similar to the surface acoustic wave device 15 of FIG. 5 and has pillars formed from a 12 micron thick region of the second metal layer. The simulation in FIG. 7A corresponds to an input power of 33 dBm and an ambient temperature of 25 degrees centigrade. As shown in the heat map of FIG. 7A, the maximum temperature of the surface acoustic wave device was 132.4 degrees centigrade. This is a considerable reduction (greater than 100 degrees centigrade) in maximum temperature compared to the simulation in FIG. 4A which used polyimide pillars and shows that providing pillars formed from regions of the second metal layer which are 12 microns thicker significantly improves thermal dissipation from the surface acoustic wave device.

Figure 7B:
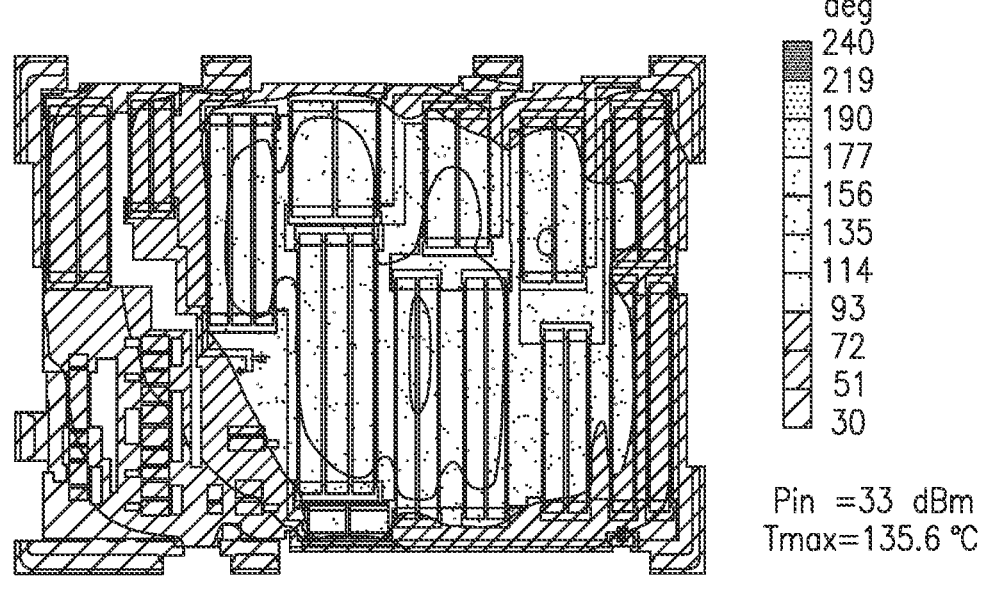
FIG. 7B is a simulated heat map of a surface acoustic wave device in which a polymeric roof layer is supported by a metal interconnect layer having a thickness of 4 microns.

FIG. 7B is a simulated heat map of another surface acoustic wave device in which a polymeric roof layer is supported by a metal interconnect layer having an increased thickness, although the thickness of the metal interconnect layer has been increased to a lesser extent than in the surface acoustic wave device used in the simulation of FIG. 7A. The simulation includes a surface acoustic wave device similar to the surface acoustic wave device 17 of FIG. 6 and has pillars formed from a 4 micron thick region of the second metal layer. The simulation in FIG. 7B corresponds to an input power of 33 dBm and an ambient temperature of 25 degrees centigrade. As shown in the heat map of FIG. 7B, the maximum temperature of the surface acoustic wave device was 135.6 degrees centigrade. Although this is not as great a reduction as was achieved in the simulation of FIG. 7A, it is still a considerable reduction (greater than 100 degrees centigrade) in maximum temperature compared to the simulation in FIG. 4A which used polyimide pillars. It shows that reducing the height of the pillars formed from regions of the second metal layer from 12 microns to 4 microns still substantially improves thermal dissipation from the surface acoustic wave device.

Figure 8:
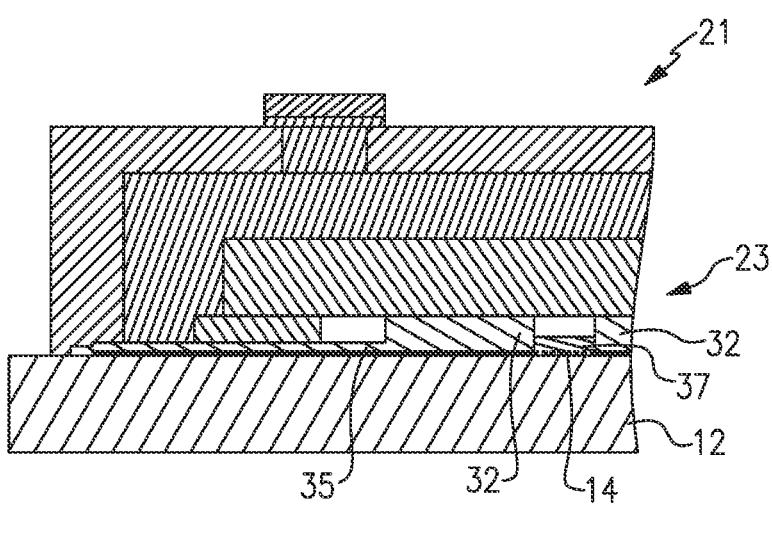
FIG. 8 is a cross-section of a portion of a surface acoustic wave device according to another embodiment.

FIG. 8 is a cross-sectional view of a portion of a wafer-level package 21 including a temperature-compensated surface acoustic wave (TC-SAW) resonator or device 23. The wafer-level package 21 and TC-SAW device 23 are like the wafer-level package 9 and surface acoustic wave device 17 of FIG. 6 except that the TC-SAW device 23 comprises a temperature compensation layer 37. The temperature compensation layer 37 is arranged over and in physical contact with the interdigital transducer electrode 14.

The temperature compensation layer 37 has a temperature coefficient of frequency which is opposite to that of the piezoelectric layer 12. In the embodiment of FIG. 8, the piezoelectric layer 12 has a negative temperature coefficient of frequency and the temperature compensation layer 37 has a positive temperature coefficient of frequency. Therefore, the temperature compensation layer 37 tends to oppose any change in frequency caused by a change in temperature of the TC-SAW device 10. Furthermore, on either side of the interdigital transducer electrode 14, each sidewall of the temperature compensation layer 37 is in contact with a pillar 32 formed from an increased thickness of the second metal layer 35. This helps to conduct heat away from the interdigital transducer electrode 14 and reduce the effect of increases in temperature on the TC-SAW device.

The temperature compensation layer 37 can be a silicon dioxide (SiO2) layer, or any other suitable temperature compensation layer. The temperature compensation layer 37 can be a layer of any other suitable material having a positive temperature coefficient of frequency. For instance, the temperature compensation layer 37 can be a tellurium dioxide (TeO2) layer or a silicon oxyfluoride (SiOF) layer in certain applications. The temperature compensation layer 37 can include any suitable combination of SiO2, TeO2, and/or SiOF. The temperature compensation layer 37 can be a passivation layer, in some applications.

Surface acoustic wave devices can be included in a filter. A filter that includes one or more surface acoustic wave devices can be referred to as a surface acoustic wave filter. Surface acoustic wave devices can be arranged as series resonators and shunt resonators to form a ladder filter. In some instances, a filter can include surface acoustic wave resonators and one or more other resonators (e.g. one or more other bulk acoustic wave resonators).

Figure 9:
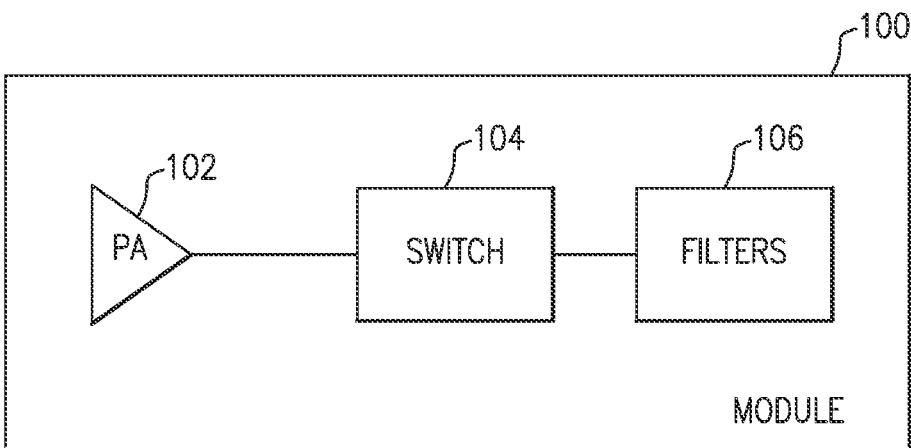
FIG. 9 is a schematic block diagram of a module that includes a power amplifier, a switch, and filters in accordance with one or more embodiments.
Figure 10:
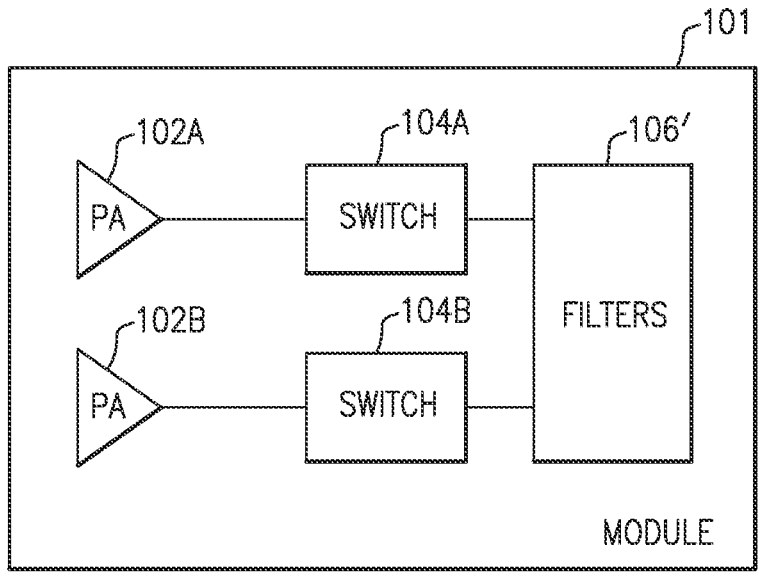
FIG. 10 is a schematic block diagram of a module that includes power amplifiers, switches, and filters in accordance with one or more embodiments.
Figure 11:
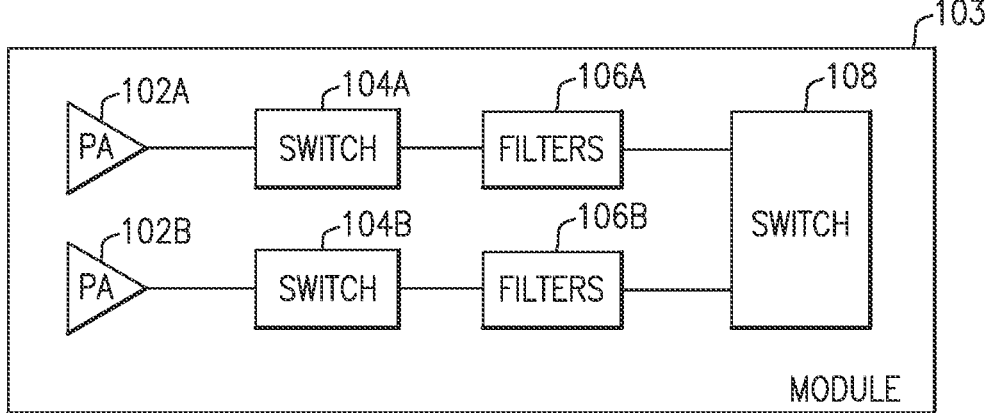
FIG. 11 is a schematic block diagram of a module that includes power amplifiers, switches, filters in accordance with one or more embodiments, and an antenna switch.

The filters discussed herein can be implemented in a variety of modules. Some example modules will now be discussed in which any suitable principles and advantages of the filters discussed herein can be implemented. FIGS. 9, 10, and 11 are schematic block diagrams of illustrative modules according to certain embodiments. A module arranged to process a radio frequency signal can be referred to as a radio frequency (RF) module.

FIG. 9 is a schematic block diagram of a module 100 that includes a power amplifier 102, a switch 104, and filters 106 in accordance with one or more embodiments. The module 100 can include a package that encloses the illustrated elements. The power amplifier 102, the switch 104, and the filters 106 can be disposed on a common packaging substrate. The packaging substrate can be a laminate substrate, for example. The power amplifier 102 can amplify a radio frequency signal. The power amplifier 102 can include a gallium arsenide bipolar transistor in certain applications. The switch 104 can be a multi-throw radio frequency switch. The switch 104 can electrically couple an output of the power amplifier 102 to a selected filter of the filters 106. The filters 106 can include any suitable number of surface acoustic wave filters and/or other acoustic wave filters. One or more of the surface acoustic wave filters of the filters 106 can be implemented in accordance with any suitable principles and advantages of the surface acoustic wave devices discussed herein.

FIG. 10 is a schematic block diagram of a module 101 that includes power amplifiers 102A and 102B, switches 104A and 104B, and filters 106' in accordance with one or more embodiments. The module 101 is like the module 100 of FIG. 9, except that the module 101 includes an additional power amplifier 102B and an additional switch 104B and the filters 106' are arranged to filter signals for the signal paths associated with a plurality of power amplifiers 102A and 102B. The different signal paths can be associated with different frequency bands and/or different modes of operation (e.g. different power modes, different signaling modes, etc.).

FIG. 11 is a schematic block diagram of a module 103 that includes power amplifiers 102A and 102B, switches 104A and 104B, and filters 106A and 106B in accordance with one or more embodiments, and an antenna switch 108. The module 103 is like the module 101 of FIG. 10, except that the module 103 includes an antenna switch 108 arranged to selectively couple a signal from the filters 106A or the filters 106B to an antenna node. The filters 106A and 106B can correspond to the filters 106' of FIG. 10.

Figure 12:
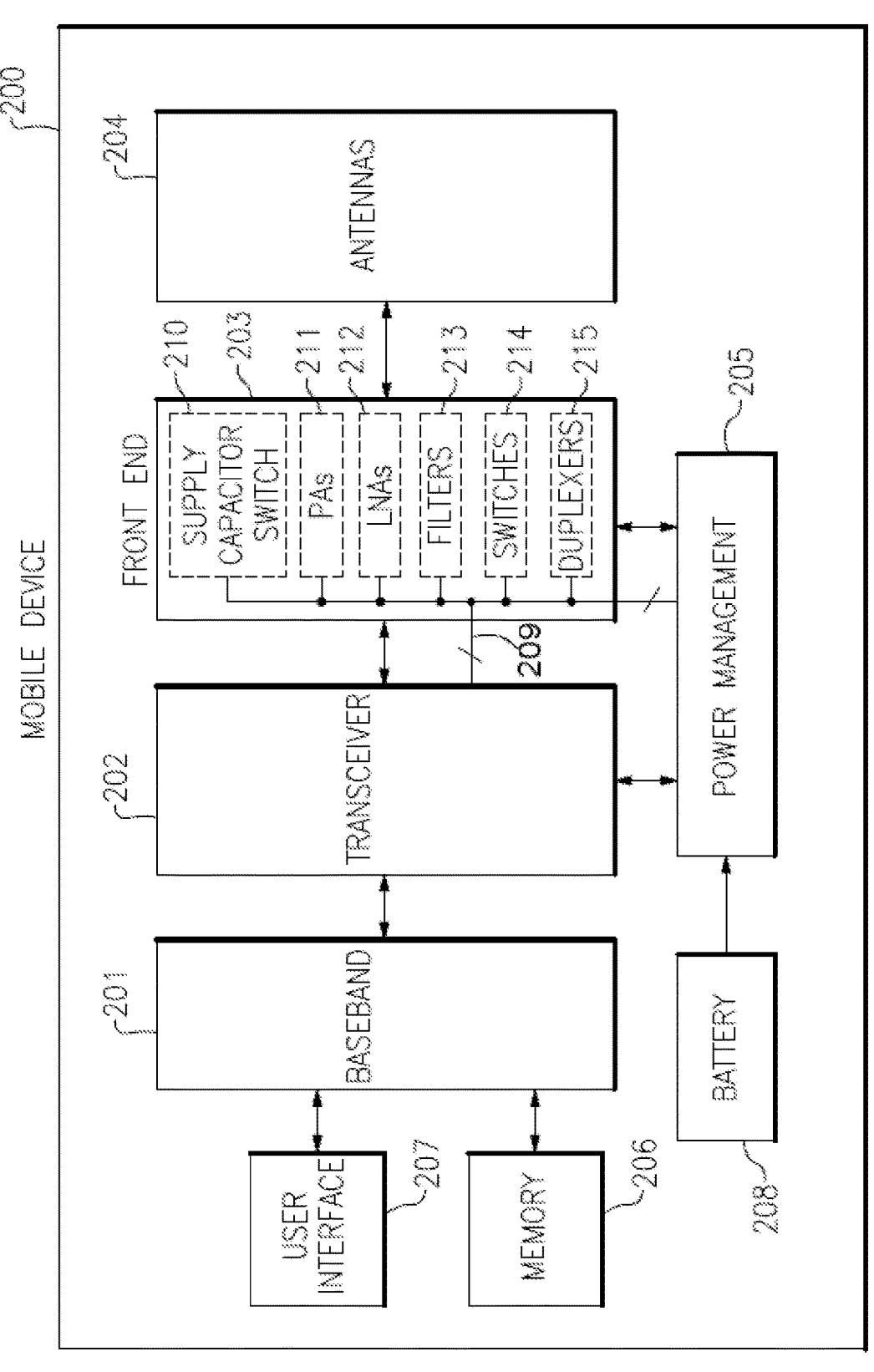
FIG. 12 is a schematic diagram of one embodiment of a wireless communication device.

FIG. 12 is a schematic diagram of one embodiment of a wireless communication device or mobile device 200. The mobile device 200 includes a baseband system 201, a transceiver 202, a front end system 203, antennas 204, a power management system 205, a memory 206, a user interface 207, and a battery 208.

Although the mobile device 200 illustrates one example of an RF system that can include one or more features of the present disclosure, the teachings herein are applicable to electronic systems implemented in a wide variety of ways.

The mobile device 200 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and Zig-Bee), WMAN (for instance, WiMax), and/or GPS technologies.

The transceiver 202 generates RF signals for transmission and processes incoming RF signals received from the antennas 204. It will be understood that various functionalities associated with the transmission and receiving of RF signals can be achieved by one or more components that are collectively represented in FIG. 12 as the transceiver 202. In one example, separate components (for instance, separate circuits or dies) can be provided for handling certain types of RF signals.

As shown in in FIG. 12, the transceiver 202 is connected to the front end system 203 and to the power management circuit 205 using a serial interface 209. All or part of the illustrated RF components can be controlled by the serial interface 209 to configure the mobile device 200 during initialization and/or while fully operational. In another embodiment, the baseband processor 201 is additionally or alternatively connected to the serial interface 209 and operates to configure one or more RF components, such as components of the front end system 203 and/or power management system 205.

The front end system 203 aids in conditioning signals transmitted to and/or received from the antennas 204. In the illustrated embodiment, the front end system 203 includes one or more bias control circuits 210 for controlling power amplifier biasing, one or more power amplifiers (PAs) 211, one or more low noise amplifiers (LNAs) 212, one or more filters 213, one or more switches 214, and one or more duplexers 215. However, other implementations are possible.

For example, the front end system 203 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 200 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 204 can include antennas used for a wide variety of types of communications. For example, the antennas 204 can include antennas for transmitting and/or receiving signals associated with a wide variety of frequencies and communications standards.

In certain implementations, the antennas 204 support multiple-input and multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 200 can operate with beamforming in certain implementations. For example, the front end system 203 can include phase shifters having variable phase controlled by the transceiver 202. Additionally, the phase shifters are controlled to provide beam formation and directivity for transmission and/or reception of signals using the antennas 204. For example, in the context of signal transmission, the phases of the transmit signals provided to the antennas 204 are controlled such that radiated signals from the antennas 204 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 204 from a particular direction. In certain implementations, the antennas 204 include one or more arrays of antenna elements to enhance beamforming.

The baseband system 201 is coupled to the user interface 207 to facilitate processing of various user input and output (I/O), such as voice and data. The baseband system 201 provides the transceiver 202 with digital representations of transmit signals, which the transceiver 202 processes to generate RF signals for transmission. The baseband system 201 also processes digital representations of received signals provided by the transceiver 202. As shown in FIG. 12, the baseband system 201 is coupled to the memory 206 to facilitate operation of the mobile device 200.

The memory 206 can be used for a wide variety of purposes, such as storing data and/or instructions to facilitate the operation of the mobile device 200 and/or to provide storage of user information.

The power management system 205 provides a number of power management functions of the mobile device 200. In certain implementations, the power management system 205 includes a power amplifier (PA) supply control circuit that controls the supply voltages of the power amplifiers 211. For example, the power management system 205 can be configured to change the supply voltage(s) provided to one or more of the power amplifiers 211 to improve efficiency, such as power added efficiency (PAE).

The power management system 205 can operate in a selectable supply control mode, such an average power tracking (APT) mode or an envelope tracking (ET) mode. In the illustrated embodiment, the selected supply control mode of the power management system 205 is controlled by the transceiver 202. In certain implementations, the transceiver 202 controls the selected supply control mode using the serial interface 209.

As shown in FIG. 12, the power management system 205 receives a battery voltage from the battery 208. The battery 208 can be any suitable battery for use in the mobile device 200, including, for example, a lithium-ion battery. Although the power management system 205 is illustrated as separate from the front end system 203, in certain implementations all or part (for instance, a PA supply control circuit) of the power management system 205 is integrated into the front end system 203.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

16

What is claimed is:

1. A surface acoustic wave device comprising:
a piezoelectric layer;
an interdigital transducer electrode disposed over the piezoelectric layer;
a polymeric roof layer arranged over the piezoelectric layer and interdigital transducer electrode, the polymeric roof layer being spaced apart from the piezoelectric layer to define a cavity to accommodate the interdigital transducer electrode, the polymeric roof layer being supported along a span of the polymeric roof layer by at least one electrically conductive pillar, a thermal conductivity of the at least one electrically conductive pillar being greater than the thermal conductivity of the polymeric roof layer; and
a metallic roof layer disposed over the polymeric roof layer, the at least one electrically conductive pillar being electrically connected to the metallic roof layer.

2. The surface acoustic wave device of claim 1 wherein the thermal conductivity of the at least one electrically conductive pillar is greater than 50 W/mK.

3. The surface acoustic wave device of claim 1 wherein the at least one electrically conductive pillar comprises a metal or metal alloy including one or more of aluminum, copper, silver, gold, or tungsten.

4. The surface acoustic wave device of claim 1 wherein the at least one electrically conductive pillar is arranged adjacent to the interdigital transducer electrode.

5. The surface acoustic wave device of claim 1 further comprising a first metal layer, the interdigital transducer electrode being formed from the first metal layer.

6. The surface acoustic wave device of claim 5 further comprising a second metal layer over at least a portion of the first metal layer, the at least one electrically conductive pillar being formed from the second metal layer.

7. The surface acoustic wave device of claim 6 wherein the second metal layer includes a first portion and a second portion adjacent the first portion, the second portion having an increased thickness relative to the first portion in a direction perpendicular to an upper surface of the piezoelectric layer at a location at which the polymeric roof layer is to be supported, the at least one electrically conductive pillar being formed from the second portion of the second metal layer.

8. The surface acoustic wave device of claim 7 wherein the second portion of the second metal layer has a thickness in a direction perpendicular to the upper surface of the piezoelectric layer at a location at which the polymeric roof layer is to be supported of between 3 microns and 15 microns.

9. The surface acoustic wave device of claim 8 wherein the second portion of the second metal layer has a thickness in a direction perpendicular to the upper surface of the piezoelectric layer at a location at which the polymeric roof layer is to be supported of between 3 microns and 8 microns.

10. The surface acoustic wave device of claim 7 wherein the first portion of the second metal layer has a thickness in a direction perpendicular to the upper surface of the piezoelectric layer at a location at which the polymeric roof layer is not supported by a pillar of between 1 micron and 2 microns.

11. The surface acoustic wave device of claim 7 wherein the at least one electrically conductive pillar is electrically connected to the metallic roof layer through the first portion of the second metal layer.

12. The surface acoustic wave device of claim 1 further comprising a polymeric perimeter wall, the polymeric perimeter wall being configured to support the polymeric roof layer around a perimeter of the polymeric roof layer.

13. The surface acoustic wave device of claim 11 wherein a height of the polymeric perimeter wall is the same as the at least one electrically conductive pillar.

14. The surface acoustic wave device of claim 1 comprising a plurality of electrically conductive pillars supporting the polymeric roof layer.

15. The surface acoustic wave device of claim 1 further comprising a temperature compensation layer disposed over and in physical contact with the interdigital transducer electrode.

16. The surface acoustic wave device of claim 15 wherein the piezoelectric layer has a negative temperature coefficient of frequency and the temperature compensation layer has a positive temperature coefficient of frequency.

17. The surface acoustic wave device of claim 16 wherein the temperature compensation layer comprises silicon dioxide.

18. A wafer-level package comprising:
a piezoelectric layer;
an interdigital transducer electrode disposed over the piezoelectric layer; and
a polymeric roof layer arranged over the piezoelectric layer and interdigital transducer electrode, the polymeric roof layer being spaced apart from the piezoelectric layer to define a cavity to accommodate the interdigital transducer electrode, the polymeric roof layer being supported along a span of the polymeric roof layer by at least one electrically conductive pillar, a thermal conductivity of the at least one electrically conductive pillar being greater than the thermal conductivity of the polymeric roof layer; and
a metallic roof layer disposed over the polymeric roof layer, the at least one electrically conductive pillar being electrically connected to the metallic roof layer.

19. A radio frequency module comprising:
a power amplifier configured to provide a radio frequency signal; and
a surface acoustic wave filter configured to filter the radio frequency signal, the surface acoustic wave filter including a piezoelectric layer, an interdigital transducer electrode disposed over the piezoelectric layer, and a polymeric roof layer arranged over the piezoelectric layer and interdigital electrode transducer, the polymeric roof layer being spaced apart from the piezoelectric layer to define a cavity to accommodate the interdigital transducer electrode, the polymeric roof layer being supported along a span of the polymeric roof layer by at least one electrically conductive pillar, a thermal conductivity of the at least one electrically conductive pillar being greater than the thermal conductivity of the polymeric roof layer; and
a metallic roof layer disposed over the polymeric roof layer, the at least one electrically conductive pillar being electrically connected to the metallic roof layer.

20. A wireless communication device comprising:
a surface acoustic wave filter configured to provide a filtered radio frequency signal, the surface acoustic wave filter including a piezoelectric layer, an interdigital transducer electrode disposed over the piezoelectric layer, and a polymeric roof layer arranged over the piezoelectric layer and interdigital transducer electrode, the polymeric roof layer being spaced apart from the piezoelectric layer to define a cavity to accommodate the interdigital transducer electrode, the polymeric roof layer being supported along a span of the polymeric roof layer by at least one electrically conductive pillar, a thermal conductivity of the at least one electrically conductive pillar being greater than the thermal conductivity of the polymeric roof layer; and
a metallic roof layer disposed over the polymeric roof layer, the at least one electrically conductive pillar being electrically connected to the metallic roof layer.

* * * * *